United States Patent
Jang et al.

(10) Patent No.: US 10,431,555 B2
(45) Date of Patent: Oct. 1, 2019

(54) METHOD OF MANUFACTURING SEMICONDUCTOR PACKAGE

(71) Applicant: DISCO CORPORATION, Tokyo (JP)

(72) Inventors: Byeongdeck Jang, Tokyo (JP); Youngsuk Kim, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/879,082

(22) Filed: Jan. 24, 2018

(65) Prior Publication Data
US 2018/0211926 A1    Jul. 26, 2018

(30) Foreign Application Priority Data

Jan. 25, 2017 (JP) ................................. 2017-011165

(51) Int. Cl.
| | |
|---|---|
| *H01L 23/552* | (2006.01) |
| *H01L 23/31* | (2006.01) |
| *H01L 21/48* | (2006.01) |
| *H01L 21/56* | (2006.01) |
| *H01L 21/78* | (2006.01) |
| *H05K 3/46* | (2006.01) |
| *H01L 23/24* | (2006.01) |

(52) U.S. Cl.
CPC ........ *H01L 23/552* (2013.01); *H01L 21/4857* (2013.01); *H01L 21/561* (2013.01); *H01L 21/565* (2013.01); *H01L 21/78* (2013.01); *H01L 23/3128* (2013.01); *H01L 23/24* (2013.01); *H01L 2224/48091* (2013.01); *H01L 2224/48227* (2013.01); *H01L 2924/15311* (2013.01); *H05K 3/4697* (2013.01)

(58) Field of Classification Search
CPC . H05K 3/4697; H01L 23/5389; H01L 23/522; H01L 23/14; H01L 21/13; H01L 23/12; H01L 21/78; H01L 23/13
See application file for complete search history.

(56) References Cited

U.S. PATENT DOCUMENTS

| | | | | |
|---|---|---|---|---|
| 5,352,925 A * | 10/1994 | Sudoh | ................... | H01L 23/552 257/659 |
| 5,440,452 A * | 8/1995 | Kitahara | ............... | H01L 21/563 174/254 |
| 9,337,116 B2 * | 5/2016 | Pagaila | ............... | H01L 23/3128 |

(Continued)

FOREIGN PATENT DOCUMENTS

| | | | | |
|---|---|---|---|---|
| EP | 1 429 387 A2 * | 6/2004 | ........... | H01L 23/552 |
| JP | 2012-039104 | 2/2012 | | |

*Primary Examiner* — Mary A Wilczewski
(74) *Attorney, Agent, or Firm* — Greer Burns & Crain, Ltd.

(57) ABSTRACT

Disclosed herein is a method of manufacturing a semiconductor package including a semiconductor chip sealed by a sealing synthetic resin. The method includes preparing a wiring board in which upstanding encircling walls with side-surface shield layers embedded therein surround mounts on which semiconductor chips are to be mounted, mounting the semiconductor chips on the mounts surrounded by the upstanding encircling walls on the wiring board, supplying a sealing synthetic resin to spaces surrounded by the upstanding encircling walls thereby to produce an sealed board, dividing the sealed board along projected dicing lines into individual semiconductor packages, and forming an upper-surface shield layer for blocking electromagnetic waves on the semiconductor packages.

12 Claims, 11 Drawing Sheets

(56) References Cited

U.S. PATENT DOCUMENTS

| | | | | |
|---|---|---|---|---|
| 9,390,993 B2* | 7/2016 | Zhao | | H01L 21/568 |
| 9,601,415 B2* | 3/2017 | Makino | | H01L 23/49541 |
| 9,793,222 B1* | 10/2017 | Lee | | H01L 23/552 |
| 9,936,583 B2* | 4/2018 | Hayashi | | H05K 1/115 |
| 2003/0000737 A1* | 1/2003 | Liu | | B81B 7/0041 |
| | | | | 174/256 |
| 2007/0190747 A1* | 8/2007 | Humpston | | B81C 1/00285 |
| | | | | 438/460 |
| 2007/0262462 A1* | 11/2007 | Shimizu | | H01L 21/561 |
| | | | | 257/773 |
| 2009/0050990 A1* | 2/2009 | Aono | | B81C 1/00873 |
| | | | | 257/415 |
| 2009/0057800 A1* | 3/2009 | Suzuki | | H01L 23/49833 |
| | | | | 257/434 |
| 2009/0102071 A1* | 4/2009 | Kindo | | H01L 23/544 |
| | | | | 257/797 |
| 2009/0107708 A1* | 4/2009 | Takahashi | | H05K 1/183 |
| | | | | 174/257 |
| 2009/0133904 A1* | 5/2009 | Koga | | H05K 3/0052 |
| | | | | 174/251 |
| 2009/0215231 A1* | 8/2009 | Inoue | | H01L 24/82 |
| | | | | 438/125 |
| 2009/0289361 A1* | 11/2009 | Fujii | | H01L 23/49816 |
| | | | | 257/737 |
| 2009/0294156 A1* | 12/2009 | Ueno | | H01L 23/13 |
| | | | | 174/255 |
| 2010/0051326 A1* | 3/2010 | Sagisaka | | H05K 1/141 |
| | | | | 174/254 |
| 2010/0084175 A1* | 4/2010 | Suzuki | | H01L 21/4857 |
| | | | | 174/260 |
| 2010/0132980 A1* | 6/2010 | Takahashi | | H05K 1/142 |
| | | | | 174/250 |
| 2010/0155110 A1* | 6/2010 | Watanabe | | H01L 21/561 |
| | | | | 174/255 |
| 2010/0208442 A1* | 8/2010 | Asano | | H01L 21/563 |
| | | | | 361/783 |
| 2011/0057327 A1* | 3/2011 | Yoshida | | H01L 21/6835 |
| | | | | 257/777 |
| 2011/0193203 A1* | 8/2011 | Goto | | H01L 23/5389 |
| | | | | 257/659 |
| 2011/0278741 A1* | 11/2011 | Chua | | H01L 21/561 |
| | | | | 257/777 |
| 2012/0018859 A1* | 1/2012 | Tashiro | | B29C 45/0046 |
| | | | | 257/666 |
| 2012/0126402 A1* | 5/2012 | Hatakeyama | | H01L 21/561 |
| | | | | 257/737 |
| 2012/0146242 A1* | 6/2012 | Fujishima | | H01L 21/561 |
| | | | | 257/777 |
| 2012/0238060 A1* | 9/2012 | Sakata | | H01L 21/563 |
| | | | | 438/124 |
| 2013/0107481 A1* | 5/2013 | Shimizu | | H05K 3/0097 |
| | | | | 361/761 |
| 2013/0292815 A1* | 11/2013 | Tashiro | | H01L 23/495 |
| | | | | 257/676 |
| 2013/0292850 A1* | 11/2013 | Chua | | H01L 21/561 |
| | | | | 257/774 |
| 2014/0030471 A1* | 1/2014 | Otsubo | | H05K 1/183 |
| | | | | 428/76 |
| 2014/0268594 A1* | 9/2014 | Wang | | H05K 1/183 |
| | | | | 361/749 |
| 2014/0353846 A1* | 12/2014 | Chua | | H01L 21/561 |
| | | | | 257/774 |
| 2015/0077960 A1* | 3/2015 | Gonzales | | B23K 1/0016 |
| | | | | 361/764 |
| 2015/0173258 A1* | 6/2015 | Chen | | H05K 13/046 |
| | | | | 361/753 |
| 2015/0236003 A1* | 8/2015 | Konno | | H01L 25/50 |
| | | | | 438/107 |
| 2015/0282325 A1* | 10/2015 | Fujii | | G01R 31/2818 |
| | | | | 361/767 |
| 2015/0303075 A1* | 10/2015 | Han | | H01L 23/49805 |
| | | | | 438/113 |
| 2015/0342049 A1* | 11/2015 | Tsuchida | | H01L 21/78 |
| | | | | 361/804 |
| 2016/0105960 A1* | 4/2016 | Sakamoto | | H01L 21/486 |
| | | | | 361/720 |
| 2016/0174365 A1* | 6/2016 | Lin | | H01L 23/49822 |
| | | | | 174/251 |
| 2016/0205778 A1* | 7/2016 | Lin | | H01L 24/97 |
| | | | | 174/264 |
| 2016/0262292 A1* | 9/2016 | Kuk | | B05B 15/20 |
| 2016/0278214 A1* | 9/2016 | Hayashi | | H01L 24/17 |
| 2016/0366762 A1* | 12/2016 | Lin | | H01L 23/5389 |
| 2017/0018505 A1* | 1/2017 | Lin | | H01L 23/5389 |
| 2017/0062390 A1* | 3/2017 | Chua | | H01L 21/561 |
| 2017/0110413 A1* | 4/2017 | Chen | | H01L 21/3205 |
| 2017/0133309 A1* | 5/2017 | Kim | | H01L 23/5389 |
| 2017/0162556 A1* | 6/2017 | Lin | | H01L 25/50 |
| 2017/0194300 A1* | 7/2017 | Lin | | H01L 23/34 |
| 2017/0257952 A1* | 9/2017 | Adachi | | H05K 3/3452 |
| 2018/0096948 A1* | 4/2018 | Kim | | B23K 26/402 |
| 2018/0114757 A1* | 4/2018 | Lee | | H01L 23/552 |
| 2018/0130709 A1* | 5/2018 | Yamashita | | H01L 21/2686 |
| 2018/0204802 A1* | 7/2018 | Lin | | H01L 23/36 |
| 2018/0211926 A1* | 7/2018 | Jang | | H01L 21/78 |
| 2018/0261535 A1* | 9/2018 | Lin | | H01L 21/4857 |

* cited by examiner

METHOD OF MANUFACTURING SEMICONDUCTOR PACKAGE

BACKGROUND OF THE INVENTION

Field of the Invention

The present invention relates to a method of manufacturing a semiconductor package having a shield function.

Description of the Related Art

Generally, semiconductor packages for use in mobile communication equipment such as mobile phones or the like are required to prevent electromagnetic noise from leaking out of the semiconductor packages. There has been known a semiconductor package where a semiconductor chip mounted on a wiring board is sealed by synthetic resin (sealing synthetic resin) and a shield layer is formed along the outer surface of the resin layer (see, for example, Japanese Patent Laid-Open No. 2012-039104). The shield layer is occasionally made of sheet metal. However, if the shield layer has an increased thickness, then it tends to present an obstacle to efforts to make semiconductor packages smaller or thinner. Various technologies have been proposed in the art to produce a thinner shield layer by way of a sputtering process, a spray coating process, a chemical vapor deposition (CVD) process, an ink jet process, or a screen printing process, etc.

SUMMARY OF THE INVENTION

The semiconductor package disclosed in Japanese Patent Laid-Open No. 2012-039104 has side surfaces extending perpendicularly to an upper surface thereof. Therefore, it is difficult to form a shield layer on the side surfaces to the same thickness as a shield layer on the upper surface. In addition, since the processes referred to above for forming a shield layer, such as sputtering, etc. grow a shield layer of a material supplied from above on the semiconductor package, it takes a long period of time to grow a shield layer on the side surfaces of the semiconductor package.

It is therefore an object of the present invention to provide a method of manufacturing a semiconductor package in a manner to be able to efficiently form a shield layer to a predetermined thickness.

In accordance with an aspect of the present invention, there is provided a method of manufacturing a semiconductor package including a semiconductor chip sealed by a sealing synthetic resin, including steps of preparing a wiring board having a plurality of mounts for mounting semiconductor chips thereon, the mounts being disposed in respective areas demarcated on an upper surface of a wiring board by a plurality of projected dicing lines which cross each other, upstanding encircling walls disposed between the mounts and the projected dicing lines in surrounding relation to the mounts individually, and side-surface shield layers for blocking electromagnetic waves, disposed individually in the upstanding encircling walls in surrounding relation to the mounts and extending in thicknesswise directions of the upstanding encircling walls, mounting the semiconductor chips individually on the mounts on the wiring board, supplying a sealing synthetic resin to spaces surrounded by the upstanding encircling walls over the semiconductor chips mounted on the mounts on the wiring board to seal the semiconductor chips, thereby producing an sealed board, after the sealed board has been produced, dividing the sealed board along the projected dicing lines into individual semiconductor packages, and after the sealed board has been produced, forming an upper-surface shield layer for blocking electromagnetic waves on upper surfaces of the sealing synthetic resin of the semiconductor packages.

With the above arrangement, the side-surface shield layers for blocking electromagnetic waves are disposed individually in the upstanding encircling walls in surrounding relation to the mounts and extend in thicknesswise directions of the upstanding encircling walls. With the upper-surface shield layer formed on the sealing synthetic resin of the semiconductor packages, therefore, the upper and side surfaces of the semiconductor chips are shielded by the upper-surface shield layer and the side-surface shield layers. Since the upper-surface shield layer may be formed of a material supplied from above only on the upper surfaces of the sealing synthetic resin of the semiconductor packages, shield layers can efficiently be formed to predetermined film thicknesses in and on the semiconductor packages.

Preferably, the method further includes a step of, after the sealed board has been produced and before the upper-surface shield layer is formed, planarizing the surfaces of the sealing synthetic resin and removing the sealing synthetic resin supplied to upper surfaces of the upstanding encircling walls, thereby exposing tip ends of the side-surface shield layers disposed individually in the upstanding encircling walls on the upper surfaces of the upstanding encircling walls.

Preferably, the method further includes a step of, after the sealed board has been produced, removing the sealing synthetic resin supplied to upper surfaces of the upstanding encircling walls along the side-surface shield layers, thereby exposing tip ends of the side-surface shield layers disposed individually in the upstanding encircling walls.

Preferably, the step of preparing the wiring board includes a step of laminating a plurality of insulating films having openings defined therein through which the semiconductor chips are to be mounted on the mounts and filled with an electrically conductive material in surrounding relation to the openings, thereby producing the upstanding encircling walls and the side-surface shield layers.

Preferably, the step of preparing the wiring board includes steps of sealing the mounts on the wiring board with an electrically conductive agent which is applied in surrounding relation to the mounts, and bonding an open interposer having a plurality of opening defined therein through which the semiconductor chips are to be mounted on the mounts and including an electrically conductive material surrounding the openings, to the wiring board with the openings being positioned individually over the mounts on the wiring board, thereby producing the upstanding encircling walls and the side-surface shield layers. The step of supplying the sealing synthetic resin includes the step of sealing the wiring board with the semiconductor chips mounted thereon, the open interposer, and the electrically conductive agent with the sealing synthetic resin, thereby producing the sealed board.

Preferably, the step of preparing the wiring board includes steps of placing a plurality of electrically conductive agents at spaced intervals in surrounding relation to the mounts individually, on the wiring board, and bonding an open interposer having a plurality of opening defined therein through which the semiconductor chips are to be mounted on the mounts and including an electrically conductive material surrounding the openings, to the wiring board with the openings being positioned individually over the mounts on the wiring board, thereby producing the upstanding encircling walls and the side-surface shield layers. The spaced intervals between the electrically conductive agents are smaller than the wavelength of the electromagnetic waves to block the electromagnetic waves. The step of supplying the sealing synthetic resin includes the step of sealing the wiring board with the semiconductor chips mounted thereon, the open interposer, and the electrically conductive agents with the sealing synthetic resin, thereby producing the sealed board.

According to the present invention, the side-surface shield layers for blocking electromagnetic waves are disposed individually in the upstanding encircling walls in surrounding relation to the mounts and extend in thicknesswise directions of the upstanding encircling walls. Since the upper-surface shield layer may be formed of a material supplied from above only on the upper surfaces of the sealing synthetic resin of the semiconductor packages, shield layers can efficiently be formed to predetermined film thicknesses in and on the semiconductor packages.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
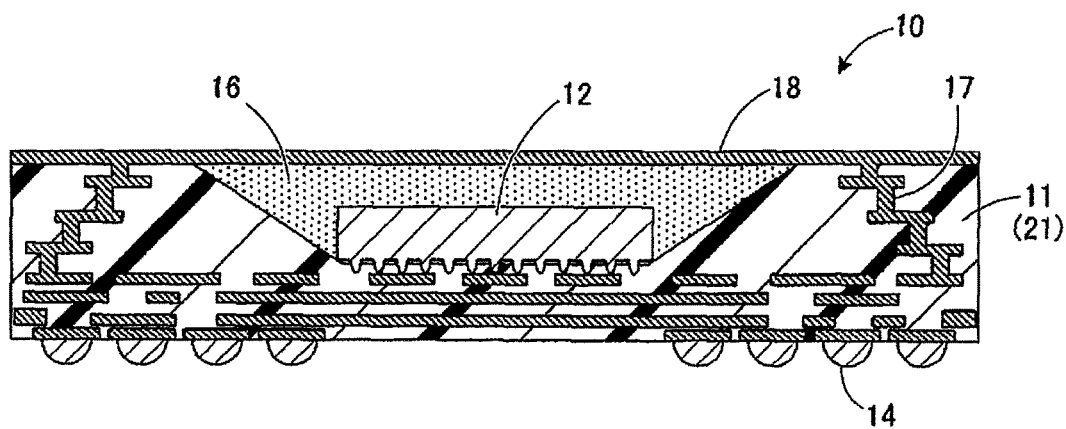
FIG. 1 is a schematic cross-sectional view of a semiconductor package according to a first embodiment of the present invention.

Methods of manufacturing semiconductor packages according to preferred embodiments of the present invention will hereinafter be described below with reference to the accompanying drawings. FIG. 1 depicts in schematic cross section a semiconductor package according to a first embodiment of the present invention. The manufacturing methods according to the embodiments of the present invention to be described below are given by way of illustrative example only, and the steps thereof may be interspersed with other steps or may be switched around appropriately.

As depicted in FIG. 1, a semiconductor package 10 may be any of all semiconductor packages that need to be shielded from electromagnetic interference (EMI), and is mounted in communication equipment or the like through bumps 14 on a lower surface of a wiring board (interposer board) 11. A semiconductor chip 12 is mounted in an upper surface of the wiring board 11 and sealed by a sealing synthetic resin 16 that fills up the upper surface of the wiring board 11 over the semiconductor chip 12. The wiring board 11 contains therein electrodes connected to the semiconductor chip 12 and various interconnects including ground lines.

The semiconductor chip 12 is produced as one of individual device chips divided from a semiconductor wafer that includes a semiconductor substrate made of silicon, gallium arsenide, or the like and a plurality of devices formed thereon. The semiconductor chip 12 is electrically connected to the wiring board 11 by wire bonding. The semiconductor package 10 includes a shield layer for preventing electromagnetic noise from leaking to electronic circuits, etc. around the semiconductor package 10. Normally, since an electrically conductive film is grown as a shield layer on the semiconductor package 10 by sputtering a material supplied from above, it is difficult to form electrically conductive films on the side surfaces of the semiconductor package 10, and it takes a long period of time to form the shield layer to a desired thickness.

According to the present embodiment, the semiconductor package 10 includes an upstanding encircling wall 21 that surrounds the semiconductor chip 12 in the wiring board 11, shielding the periphery of the semiconductor chip 12 with an electrically conductive material embedded in the upstanding encircling wall 21. A side-surface shield layer 17 is formed of the electrically conductive material in the upstanding encircling wall 21. An upper-surface shield layer 18 is also formed on the upper surface of the semiconductor package 10 by sputtering or the like. Since it is not necessary to form a shield layer on the side surfaces of the semiconductor package 10 by sputtering or the like, it is possible to efficiently form shield layers to predetermined thicknesses in and on the semiconductor package 10.

First Embodiment

Figure 2:
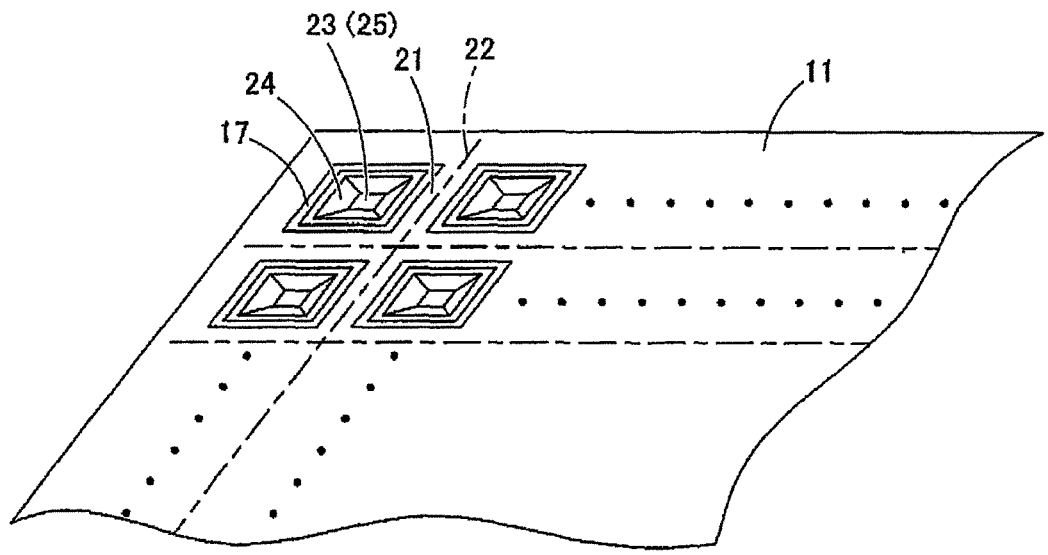
FIG. 2 is a fragmentary perspective view of a wiring board of the semiconductor package according to the first embodiment.
Figure 3A:
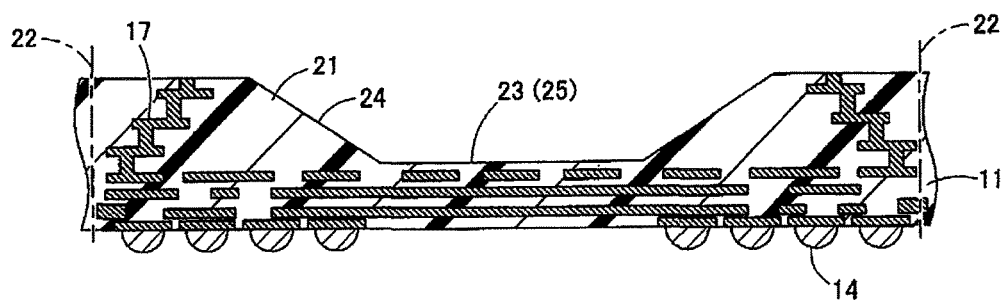
FIGS. 3A through 3C are cross-sectional views illustrative of a method of manufacturing the semiconductor package according to the first embodiment.
Figure 3B:
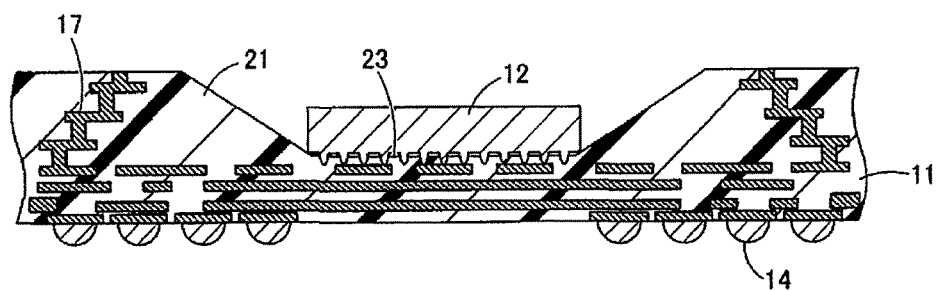
Figure 3C:
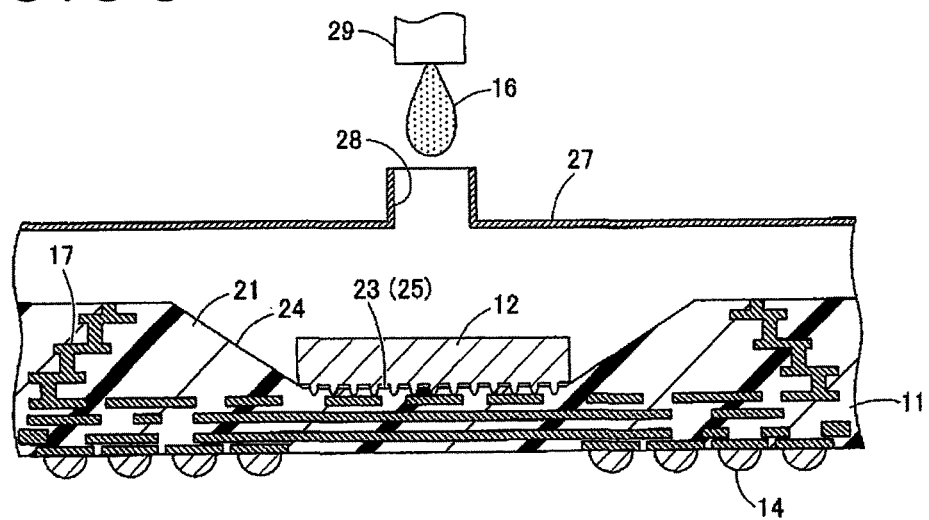
Figure 4A:
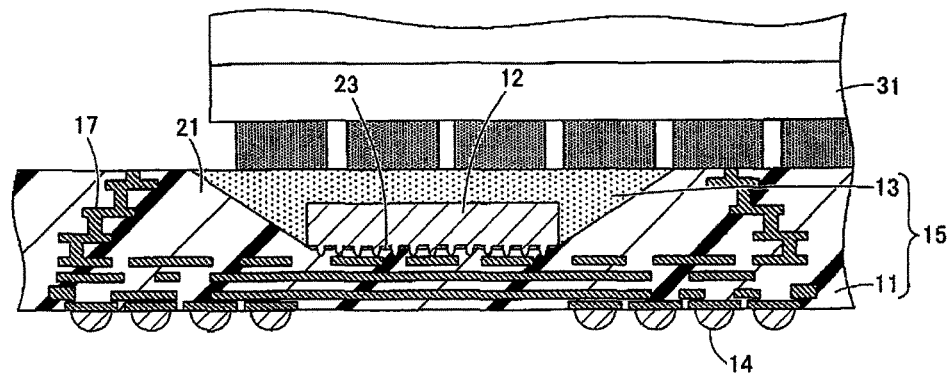
FIGS. 4A through 4C are cross-sectional views illustrative of the method of manufacturing the semiconductor package according to the first embodiment.
Figure 4B:
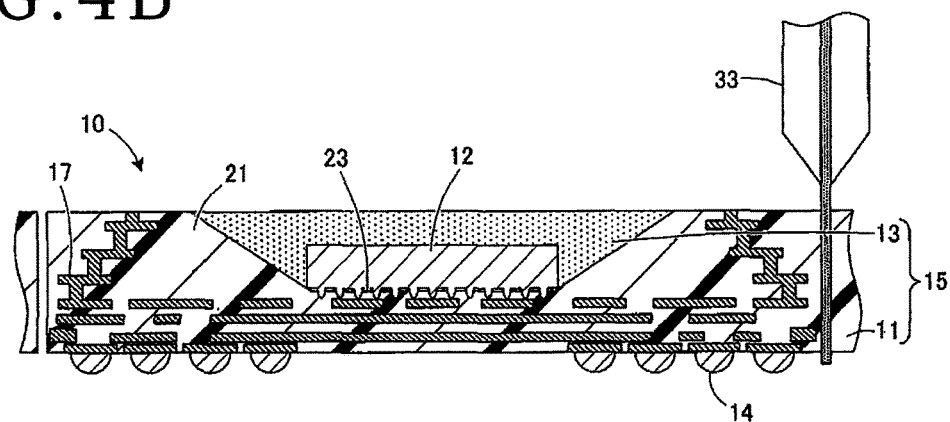
Figure 4C:
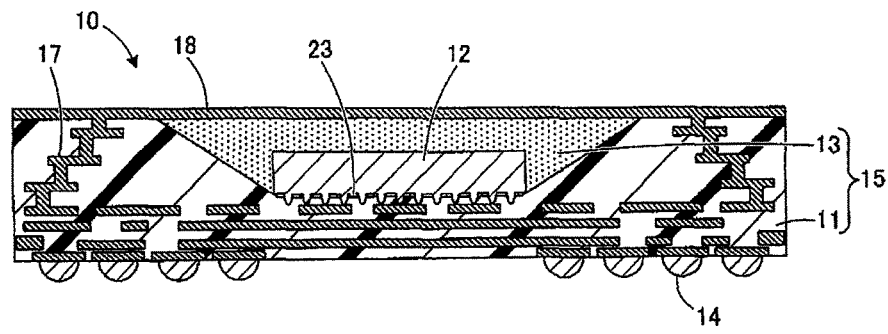
Figure 5A:
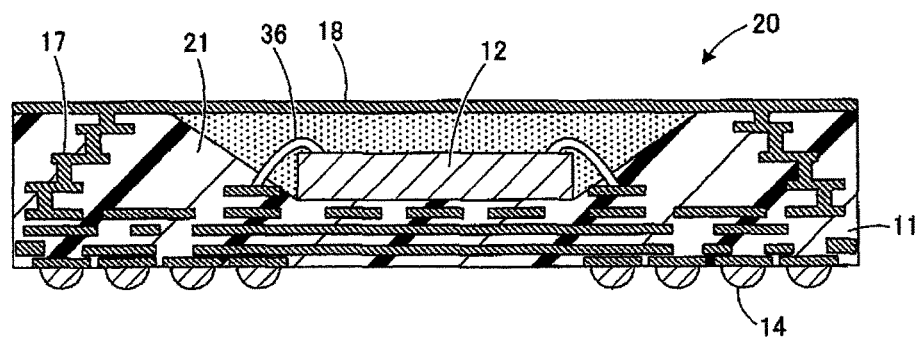
FIGS. 5A through 5C are cross-sectional views illustrative of a modification of the method of manufacturing the semiconductor package according to the first embodiment.
Figure 5B:
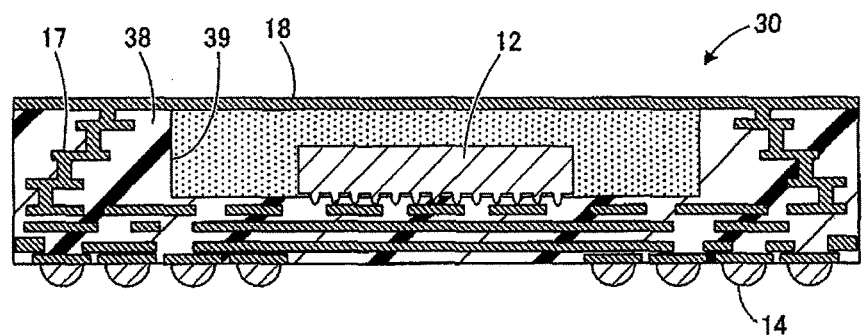
Figure 5C:
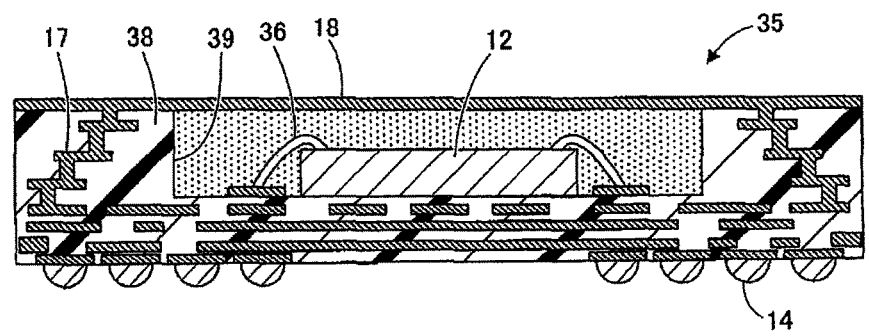

A method of manufacturing a semiconductor package according to a first embodiment of the present invention will hereinafter be described below with reference to FIGS. 2 through 5C. FIG. 2 is a fragmentary perspective view of a wiring board of the semiconductor package according to the first embodiment. FIGS. 3A through 3C and FIGS. 4A through 4C are cross-sectional views illustrative of a method of manufacturing the semiconductor package according to the first embodiment. FIGS. 5A through 5C are cross-sectional views illustrative of a modification of the method of manufacturing the semiconductor package according to the first embodiment. FIG. 3A illustrates a wiring board preparing step, FIG. 3B illustrates a chip mounting step, and FIG. 3C illustrates an sealed board forming step. FIG. 4A illustrates a grinding step, FIG. 4B illustrates an individualizing step, and FIG. 4C illustrates an upper-surface shield layer forming step.

As depicted in FIGS. 2 and 3A, the wiring board preparing step is initially performed. In the wiring board preparing step, a wiring board 11 having various interconnects embedded therein for a semiconductor chip 12 (see FIG. 3B) is prepared. The upper surface of the wiring board 11 is demarcated into a plurality of areas by a grid of projected dicing lines 22 crossing each other, and the demarcated areas have respective mounts 23 on which semiconductor chips 12 are to be mounted. Upstanding encircling walls 21 are formed in surrounding relation to the respective mounts 23 between the mounts 23 and the projected dicing lines 22. The upstanding encircling walls 21 are of a height larger than the thickness of the semiconductor chips 12 to be mounted on the respective mounts 23.

Each of the upstanding encircling walls 21 has an inner peripheral surface including as a slanted surface 24 that provides an opening whose area is progressively smaller toward the mount 23. A side-surface shield layer 17 for blocking electromagnetic noise (electromagnetic waves) is formed in the upstanding encircling wall 21 in surrounding relation to the mount 23 and extends in the thicknesswise directions of the upstanding encircling wall 21. The wiring board 11 is thus shaped such that a cavity 25 is defined in the upper surface thereof and the mount 23 is disposed at the bottom of the cavity 25. Each upstanding encircling wall 21 is disposed between adjacent cavities 25. The wiring board 11 contains therein various interconnects including ground lines. Bumps 14 are disposed on a lower surface of the wiring board 11.

As depicted in FIG. 3B, the wiring board preparing step is followed by a chip mounting step. In the chip mounting step, a semiconductor chip 12 is mounted on each of the mounts 23 in the wiring board 11. Electrodes on the lower surface of the semiconductor chip 12 are directly connected to electrodes on the upper surface of the mount 23 by way of flip-chip bonding. The semiconductor chip 12 and the mount 23 are joined by an electrically conductive adhesive or the like and reinforced by an underfill or the like therebetween. Since the thickness of the semiconductor chip 12 is smaller than the thickness of the upstanding encircling wall 21, the semiconductor chip 12 is reliably shielded sideways by the side-surface shield layer 17 embedded in the upstanding encircling wall 21. The structure in which the thickness of the semiconductor chip 12 is smaller than the thickness of the upstanding encircling wall 21 is not restrictive, but the thickness of the semiconductor chip 12 may be larger than the thickness of the upstanding encircling wall 21. In such a modification, the semiconductor chip and a sealing agent may be ground to the same height as the upstanding encircling wall 21 in a grinding step to be described later.

As depicted in FIG. 3C, a sealing board forming step is carried out after the chip mounting step. In the sealing board forming step, a sealing synthetic resin 16 is supplied to the cavities or spaces defined by the upstanding encircling walls 21 of the wiring board 11 on which the semiconductor chips 12 have been mounted, sealing the semiconductor chips 12 with the sealing synthetic resin 16 to thereby form an sealed board 15 (see FIG. 4A). Specifically, the lower surface of the wiring board 11 has been held in position by a holding jig, not depicted, for use in a sealing process, and a frame die 27 has been placed in covering relation to the upper surface of the wiring board 11. The frame die 27 has an inlet port 28 defined in its upper wall, and a supply nozzle 29 for supplying the sealing synthetic resin 16 is positioned above the inlet port 28.

The supply nozzle 29 supplies the sealing synthetic resin 16 through the inlet port 28 onto the upper surface of the wiring board 11, sealing each of the semiconductor chips 12. The sealing synthetic resin 16 is then cured by being heated or dried, thereby forming the sealed board 15 in which a synthetic resin layer 13 (see FIG. 4A) is formed on the upper surface of the wiring board 11. The sealing synthetic resin 16 includes a curable synthetic resin such as epoxy resin, silicon resin, urethane resin, unsaturated polyester resin, acrylic urethane resin, polyimide resin, or the like, for example. In this manner, the semiconductor chips 12 on the wiring board 11 are sealed altogether.

When the sealing synthetic resin 16 is supplied through the inlet port 28 onto the upper surface of the wiring board 11, as the inner peripheral surfaces of the upstanding encircling wall 21 are slanted as the slanted surfaces 24 toward the mount 23, the sealing synthetic resin 16 flows along the slanted surfaces 24 to the mount 23. Therefore, the cavity 25 defined in the wiring board 11 is easily filled up with the sealing synthetic resin 16. The slanted surfaces 24 are gradually slanted to make it difficult for air bubbles to remain trapped in the sealing synthetic resin 16. Furthermore, inasmuch as the semiconductor chip 12 is sealed in its entirety by the sealing synthetic resin 16, the reinforcement of the semiconductor chip 12 and the mount 23 with the underfill or the like therebetween in the chip mounting step may be dispensed with.

As depicted in FIG. 4A, the sealed board forming step is followed by a grinding step (removing step). In the grinding step, the surface of the synthetic resin layer 13 over the semiconductor chip 12 in the cavity is planarized and the synthetic resin layer 13 on the upper surface of the upstanding encircling wall 21 is removed by grinding. Specifically, the sealed board 15 is held by a holding jig of a grinding apparatus, not depicted, and then ground by a grinding wheel 31 that is held in rotational contact with the synthetic resin layer 13 of the sealed board 15. When the sealed board 15 is ground to a target thickness by the grinding wheel 31, the upper end (tip end) of the side-surface shield layer 17 in the upstanding encircling wall 21 are exposed on the upper end of the upstanding encircling wall 21.

As depicted in FIG. 4B, an individualizing step is carried out after the grinding step. In the individualizing step, the sealed board 15 is divided along the projected dicing lines into individual semiconductor packages 10. Specifically, the sealed board 15 has been held by a holding jig of a cutting apparatus, not depicted, and a cutting blade 33 has been positioned in alignment with one of the projected dicing lines outside of the sealed board 15. The cutting blade 33 includes a disk-shaped cutting blade made up of abrasive grains of diamond or the like which are bonded together by a binder, and is mounted on the tip end of a spindle, not depicted.

Outside of the sealed board 15, the cutting blade 33 is lowered to a vertical position low enough to fully cut the sealed board 15. Then, the sealed board 15 is cutting-fed horizontally to the cutting blade 33, which starts to cut into the sealed board 15 along the aligned projected dicing line upon contact with the sealed board 15. After the sealed board 15 is fully cut along the projected dicing line by the cutting blade 33, the cutting blade 33 is positioned in alignment with an adjacent projected dicing line, and fully cuts sealed board 15 along the newly aligned projected dicing line. The above cutting step is repeated along those of the projected dicing lines which are parallel to each other, and then along the remaining projected dicing lines after the capsulated board 15 is turned 90 degrees about its own axis. In this manner, the capsulated board 15 is divided into individual semiconductor packages 10 along the projected dicing lines. Because the capsulated board 15 is divided into individual semiconductor packages 10 before forming an upper-surface shield layer 18 (see FIG. 4C), to be described below, is formed on the upper surface of each of the semiconductor packages 10, the cutting ability of the cutting blade 33 is prevented from being lowered as no electrically conductive material sticks to the cutting blade 33.

Then, as depicted in FIG. 4C, an upper-surface shield layer forming step is performed after the individualizing step. In the upper-surface shield layer forming step, an upper-surface shield layer 18 for blocking electromagnetic noise (electromagnetic waves) is formed on the upper surfaces of the synthetic resin layer 13 of a plurality of semiconductor packages 10. Specifically, the semiconductor packages 10 are arrayed on a holding jig of a sputtering apparatus, not depicted, and an electrically conductive layer is grown of a material supplied from above on the semiconductor packages 10, thereby producing an upper-surface shield layer 18 on the semiconductor packages 10. Since the upper end of the side-surface shield layer 17 is exposed on the upper surfaces of the semiconductor packages 10, the upper-surface shield layer 18 and the side-surface shield layer 17 are connected to each other.

Since the upper-surface shield layer 18 may be formed only on the upper surfaces of the semiconductor packages 10, the upper-surface shield layer 18 can easily be grown to a thickness enough to provide a sufficient shield effect on the upper surfaces of the semiconductor packages 10. In this manner, the semiconductor packages 10 where upper and side surfaces of the semiconductor chips 12 are covered with the upper-surface shield layer 18 and the side-surface shield layer 17 are manufactured. The upper-surface shield layer 18 is connected to the side-surface shield layer 17, and the side-surface shield layer 17 is connected to the ground lines in the wiring board 11. Therefore, electromagnetic noise produced in the semiconductor packages 10 is released out of the semiconductor packages 10 through the ground lines.

The upper-surface shield layer 18 includes a multilayer film grown to a thickness of several µm or more from one or more of metals including copper, titanium, nickel, gold, etc., and is formed by a sputtering process, an ion plating process, a spray coating process, a CVD process, an ink jet process, or a screen printing process, for example. The upper-surface shield layer 18 may be formed as a multilayer metal film, referred to above, bonded to the upper surface of the semiconductor package 10 by a vacuum lamination process. According to a physical vapor deposition (PVD) process such as sputtering or the like, a thin shield layer, not depicted, is actually formed on the side surfaces of the semiconductor package 10, in addition to the upper-surface shield layer 18 on the upper surface thereof. However, the thin shield layer thus formed on the side surfaces of the semiconductor package 10 does not have a sufficient thickness, and the side-surface shield layer 17 formed as interconnects in the upstanding encircling wall 21 is effective to prevent electromagnetic interference according to the present embodiment.

According the first embodiment, the method of manufacturing the semiconductor package 10 by flip-chip bonding has been described. However, the method is not restrictive. According to a modification depicted in FIG. 5A, a semiconductor package 20 is manufactured by wire bonding where the electrodes of the semiconductor chip 12 and the electrodes of the wiring board 11 are connected by wires 36. The method of manufacturing the semiconductor package 20 according to the modification is the same as the method of manufacturing the semiconductor package 10 according to the first embodiment except for the bonding method, and will not be described below.

According the first embodiment, the structure in which the inner peripheral surfaces of the upstanding encircling walls 21 include slanted surfaces 24 has been described. However, the structure is not restrictive. According to a modification depicted in FIG. 5B, a semiconductor package 30 includes an upstanding encircling wall 38 whose inner peripheral surfaces include vertical surfaces 39. According to a modification depicted in FIG. 5C which incorporates the feature depicted in FIG. 5B, a semiconductor package 35 includes electrodes connected by wire bonding rather than flip-chip bonding. Furthermore, in the method of manufacturing the semiconductor package according to the first embodiment, the upper-surface shield layer forming step may be performed prior to the individualizing step.

As described above, in the method of manufacturing the semiconductor package according to the first embodiment, the side-surface shield layer 17 for blocking electromagnetic waves are formed in the upstanding encircling wall 21 of the wiring board 11 in surrounding relation to the semiconductor chip and extends in the thicknesswise directions of the upstanding encircling wall 21. With the upper-surface shield layer 18 formed on the synthetic resin layer 13 of the semiconductor package 10, therefore, the upper and side surfaces of the semiconductor chip 12 are shielded by the upper-surface shield layer 18 and the side-surface shield layer 17. Since the upper-surface shield layer 18 may be formed of a material supplied from above only on the upper surface of the semiconductor package 10, shield layers can efficiently be formed to predetermined film thicknesses in and on the semiconductor package 10.

Second Embodiment

Figure 6A:
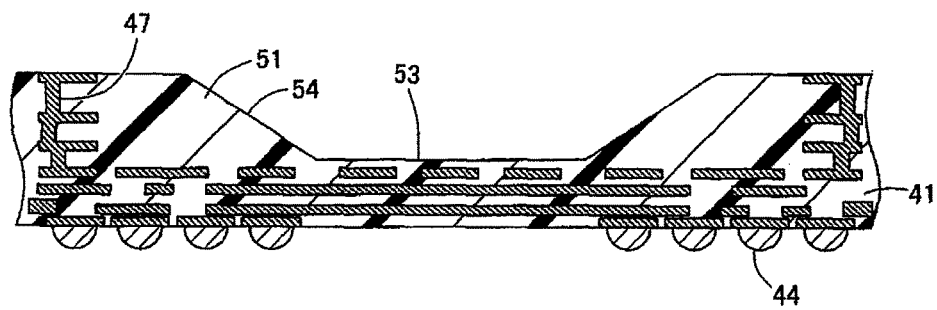
FIGS. 6A through 6C are cross-sectional views illustrative of a method of manufacturing a semiconductor package according to a second embodiment of the present invention.
Figure 6B:
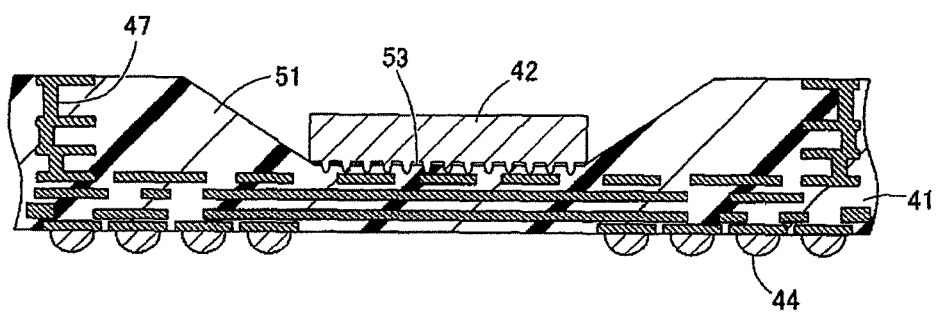
Figure 6C:
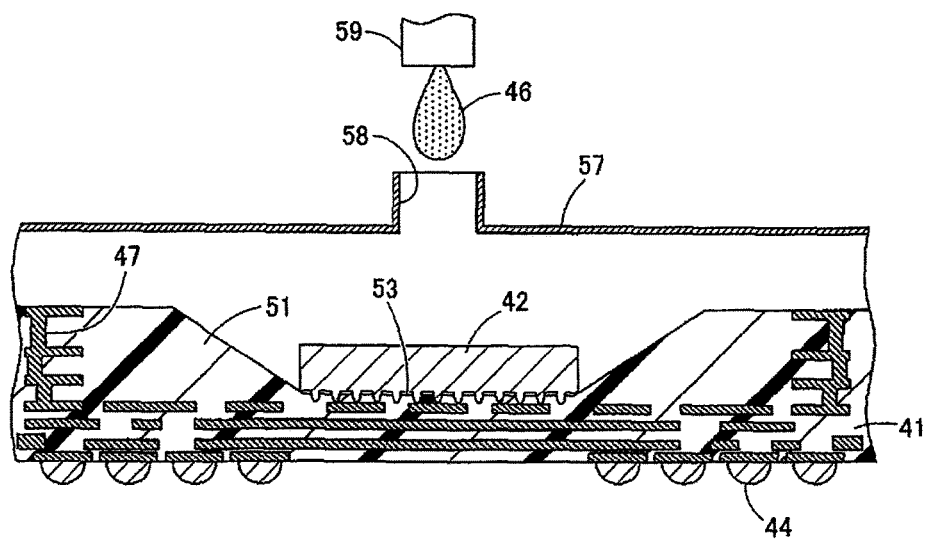
Figure 7A:
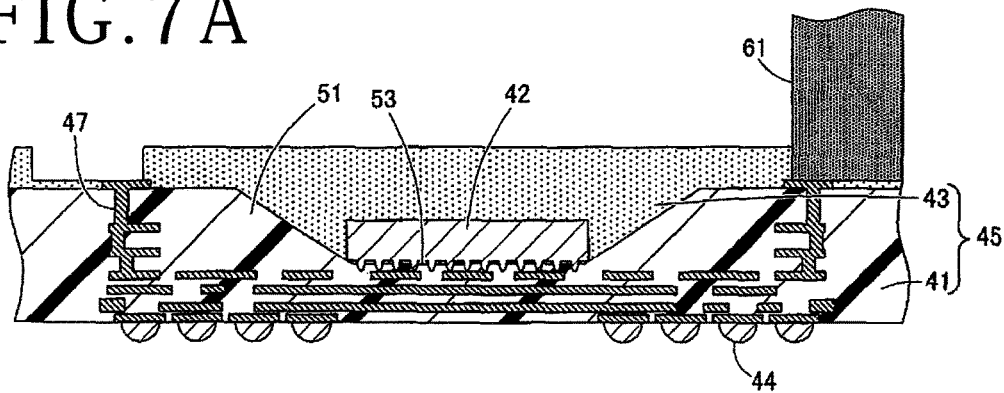
FIGS. 7A through 7C are cross-sectional views illustrative of the method of manufacturing the semiconductor package according to the second embodiment.
Figure 7B:
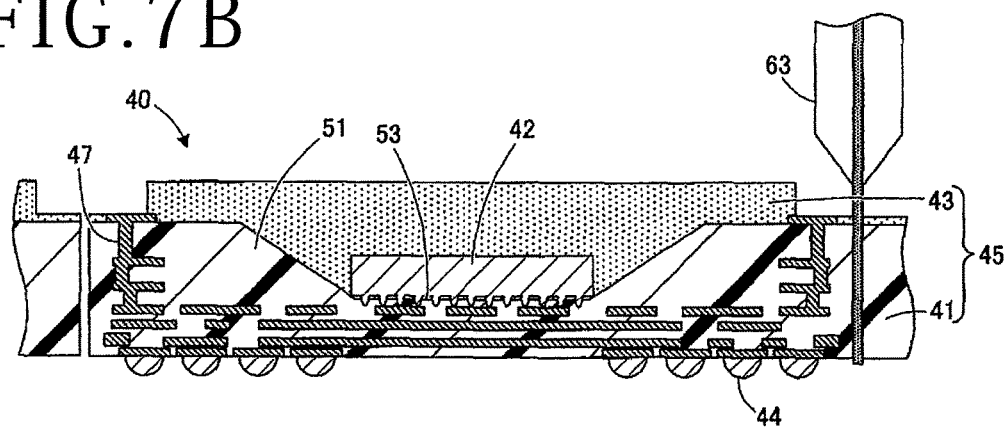
Figure 7C:
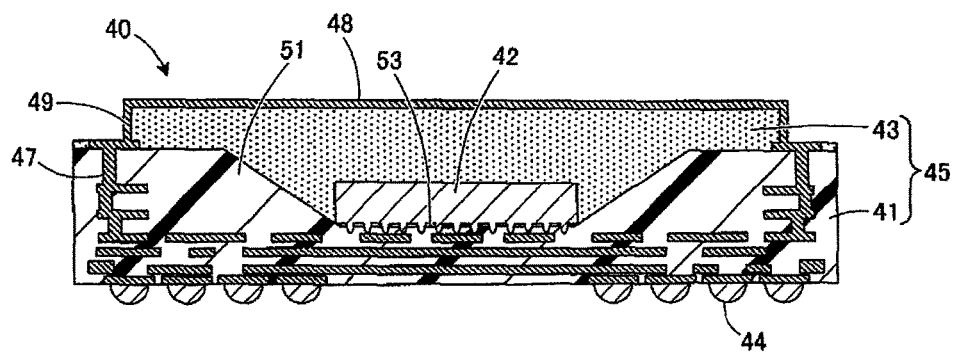
Figure 8A:
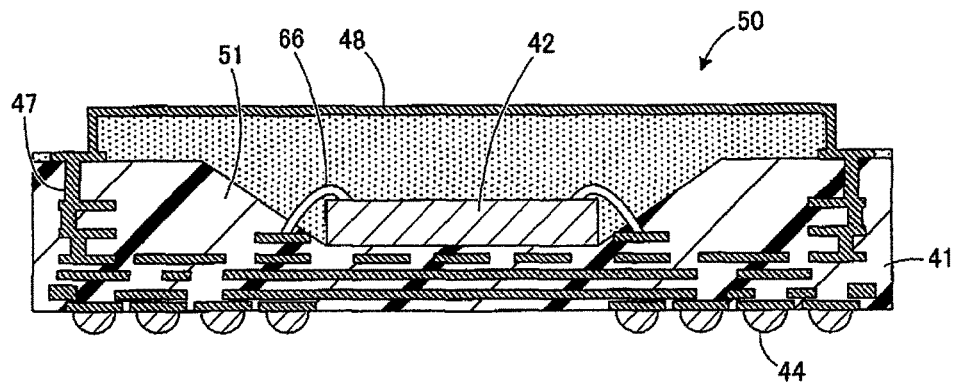
FIGS. 8A through 8C are cross-sectional views illustrative of a modification of the method of manufacturing the semiconductor package according to the second embodiment.
Figure 8B:
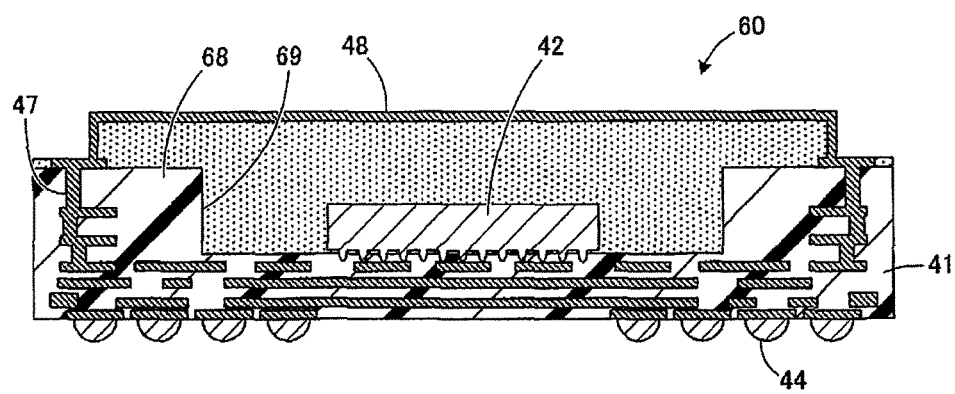
Figure 8C:
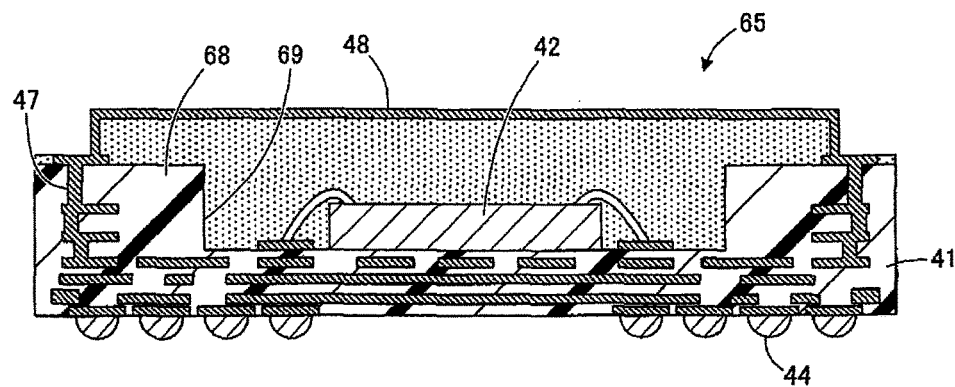

A method of manufacturing a semiconductor package according to a second embodiment of the present invention will hereinafter be described below with reference to FIGS. 6A through 8C. FIGS. 6A through 6C and FIGS. 7A through 7C are cross-sectional views illustrative of a method of manufacturing the semiconductor package according to the second embodiment. FIGS. 8A through 8C are cross-sectional views illustrative of a modification of the method of manufacturing the semiconductor package according to the second embodiment. FIG. 6A illustrates a wiring board preparing step, FIG. 6B illustrates a chip mounting step, and FIG. 6C illustrates a sealed board forming step. FIG. 7A illustrates a cutting step, FIG. 7B illustrates an individualizing step, and FIG. 7C illustrates an upper-surface shield layer forming step. The second embodiment will be described below while leaving out as many identical details as possible to those of the first embodiment.

As depicted in FIG. 6A, the wiring board preparing step is initially performed. In the wiring board preparing step, as with the first embodiment, a wiring board 41 containing various interconnects embedded therein for a semiconductor chip 42 (see FIG. 6B) is prepared. Mounts 53 on which the semiconductor chips 42 are to be mounted are formed in the wiring board 41, and upstanding encircling walls 51 are formed in surrounding relation to the respective mounts 53. Each of the upstanding encircling walls 51 has inner peripheral surfaces including slanted surfaces 54. A side-surface shield layer 47 for blocking electromagnetic noise is formed in the upstanding encircling wall 51 in surrounding relation to the mount 53 and extends in the thicknesswise directions of the upstanding encircling wall 51. The wiring board 41 contains therein various interconnects such as ground lines, etc. Bumps 44 are disposed on a lower surface of the wiring board 41.

As depicted in FIG. 6B, the wiring board preparing step is followed by a chip mounting step. In the chip mounting step, as with the first embodiment, electrodes on the lower surface of the semiconductor chip 42 are directly connected to electrodes on the upper surface of the mount 53 by way of flip-chip bonding. As depicted in FIG. 6C, a sealing board forming step is carried out after the chip mounting step. In the sealing board forming step, as with the first embodiment, a sealing synthetic resin 46 is supplied from a supply nozzle 59 through an inlet port 58 of a frame die 57, sealing the semiconductor chips 42 with the sealing synthetic resin 46 to thereby form an sealed board 45 (see FIG. 7A).

As depicted in FIG. 7A, the sealed board forming step is followed by a cutting step (removing step). In the cutting step, a synthetic resin layer 43 (sealing synthetic resin) supplied to the upper surface of the upstanding encircling wall 51 is cut along the side-surface shield layer 47 by a cutting blade 61. Specifically, the sealed board 45 has been held in position by a holding jig of a cutting apparatus, not depicted, and the cutting blade 61 has been positioned in alignment with the position where one of the side-surface shield layer 47 of the sealed board 45 is formed. The cutting blade 61 includes a disk-shaped cutting blade made up of abrasive grains of diamond or the like which are bonded together by a binder, and is mounted on the tip end of a spindle, not depicted. The cutting blade 61 is wider than a cutting blade 63 used in the individualizing step to be described below.

Outside of the sealed board 45, the cutting blade 61 is lowered to a vertical position at the height of the upper surface of the upstanding encircling wall 51. Then, the sealed board 45 is cutting-fed horizontally to the cutting blade 61, which starts to cut partly into the sealed board 45 along the aligned side-surface shield layer 47 upon contact with the sealed board 45. After the sealed board 45 is partly cut along the side-surface shield layer 47, the cutting blade 61 is aligned with an adjacent side-surface shield layer 47, and partly cuts sealed board 45 along the newly aligned side-surface shield layer 47. The above cutting step is repeated along those of the side-surface shield layer 47 which are parallel to each other, and then along the remaining side-surface shield layer 47 after the capsulated board 45 is turned 90 degrees about its own axis. In this manner, the capsulated board 45 has the synthetic resin layer 43 partly removed from the upper surfaces of the upstanding encircling walls 51 and also has the upper end of the side-surface shield layer 47 exposed from the synthetic resin layer 43 on the upstanding encircling walls 51. The second embodiment is thus different from the first embodiment in which the side-surface shield layer is exposed in the grinding step, in that shallow grooves are formed in the sealed board 45 to partly expose the side-surface shield layer 47 in the cutting step.

As depicted in FIG. 7B, an individualizing step is carried out after the cutting step. In the individualizing step, the sealed board 45, while being held on a holding jig of a cutting apparatus, not depicted, is fully cut by a cutting blade 63 and divided along projected dicing lines (shallow grooves) into individual semiconductor packages 40. The cutting blade 63 has a width smaller than the cutting blade 61 in the cutting step. The individualizing step and the cutting step may be carried out simultaneously by a twin dicer to expose the side-surface shield layer 47 with the cutting blade 61 and to individualize the sealed board 45 with the other cutting blade 63.

Then, as depicted in FIG. 7C, an upper-surface shield layer forming step is performed after the individualizing step. In the upper-surface shield layer forming step, an electrically conductive material is supplied from above to grow a film on the semiconductor package 40 as with the first embodiment. At this time, inasmuch as the synthetic resin layer 43 has been partly removed, forming steps 49, an upper-surface shield layer 48 is formed of the supplied electrically conductive material on the upper surface and the steps 49 of the semiconductor package 40. Since the upper end of the side-surface shield layer 47 is exposed on the bottoms of the steps 49, the upper-surface shield layer 48 and the side-surface shield layer 47 are connected by the film of the electrically conductive material grown on the steps 49.

In this manner, the semiconductor packages 40 where upper and side surfaces of the semiconductor chips 42 are covered with the upper-surface shield layer 48 and the side-surface shield layer 47 are manufactured. The upper-surface shield layer 48 includes a multilayer film grown to a thickness of several µm or more from one or more of metals including copper, titanium, nickel, gold, etc., and is formed by a sputtering process, an ion plating process, a spray coating process, a CVD process, an ink jet process, a screen printing process, or a vacuum lamination process, for example. According to a PVD process such as sputtering or the like, a thin shield layer, not depicted, is actually formed on the side surfaces of the semiconductor package 40, in addition to the upper-surface shield layer 48 on the upper surface thereof. However, the thin shield layer thus formed on the side surfaces of the semiconductor package 40 does not have a sufficient thickness, and the side-surface shield layer 47 formed as interconnects in the upstanding encircling wall 51 is effective to prevent electromagnetic interference according to the present embodiment.

According the second embodiment, the method of manufacturing the semiconductor package 40 by flip-chip bonding has been described. However, the method is not restrictive. According to a modification depicted in FIG. 8A, a semiconductor package 50 is manufactured by wire bonding where the electrodes of the semiconductor chip 42 and the electrodes of the wiring board 41 are connected by wires 66. The method of manufacturing the semiconductor package 50 according to the modification is the same as the method of manufacturing the semiconductor package 40 according to the second embodiment except for the bonding method, and will not be described below.

According the second embodiment, the structure in which the inner peripheral surfaces of the upstanding encircling walls 51 include slanted surfaces 54 has been described. However, the structure is not restrictive. According to a modification depicted in FIG. 8B, a semiconductor package 60 includes an upstanding encircling wall 68 whose inner peripheral surfaces include vertical surfaces 69. According to a modification depicted in FIG. 8C which incorporates the feature depicted in FIG. 8B, a semiconductor package 65 includes electrodes connected by wire bonding rather than flip-chip bonding. Furthermore, in the method of manufacturing the semiconductor package according to the second embodiment, the upper-surface shield layer forming step may be performed prior to the individualizing step. Since the shield layer are formed on the side surfaces of the steps 49, even if the thickness of the semiconductor chip 42 is larger than the thickness of the upstanding encircling wall 51, the sides of the semiconductor chip 42 can be covered with the shield layer.

In the method of manufacturing a semiconductor package according to the second embodiment, as with the first embodiment, it is possible to efficiently form shield layers to predetermined thicknesses in and on the semiconductor package 40. Furthermore, because the cutting step is performed as the removing step instead of the grinding step, the cutting apparatus may carry out the individualizing step following the cutting step for increased production efficiency.

Third Embodiment

A method of manufacturing a semiconductor package according to a third embodiment of the present invention will hereinafter be described below with reference to FIGS. 9A through 9E. The method of manufacturing a semiconductor package according to the third embodiment is different from the methods of manufacturing a semiconductor package according to the first and second embodiments only as to a wiring board preparing step. Therefore, the wiring board preparing step according to the third embodiment will be described below. FIGS. 9A through 9E are illustrative of an example of the wiring board preparing step according to the third embodiment.

Figure 9A:
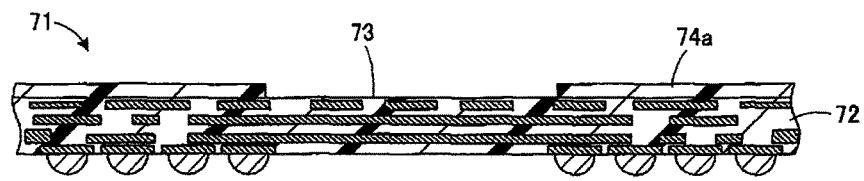
FIGS. 9A through 9E are cross-sectional views illustrative of an example of a wiring board preparing step according to a third embodiment of the present invention.

As depicted in FIGS. 9A through 9E, in the wiring board preparing step, a plurality of insulating films 74a through 74d with an opening for mounting a semiconductor chip 78 on a mount 73 are laminated into an upstanding encircling wall 75. The insulating films 74a through 74d are filled with respective annular layers 76a through 76d of an electrically conductive material, and the stacked assembly of the annular layers 76a through 76d in the insulating films 74a through 74d serve as a side-surface shield layer 77. Specifically, as depicted in FIG. 9A, a base board 72 in which electrodes and interconnects including ground lines are formed is prepared, and an insulating film 74a made of polyimide resin or the like is stacked as a first layer on the base board 72. The insulating film 74a has an opening defined therein at a position corresponding to the mount 73.

Figure 9B:
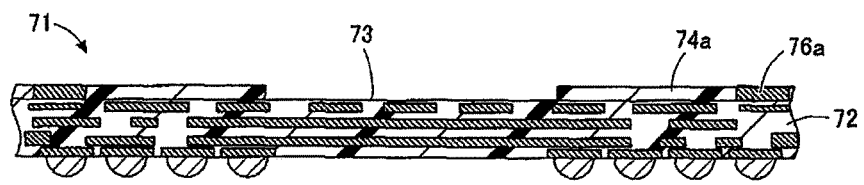
Figure 9C:
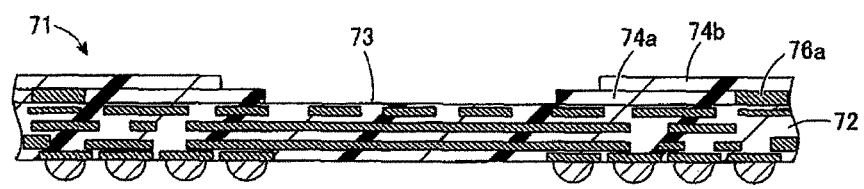

As depicted in FIG. 9B, if the insulating film 74a is made of a photosensitive synthetic resin, then the insulating film 74a is exposed to light and then developed to form a groove around the opening in the insulating film 74a. The groove is then filled with an annular layer 76a of an electrically conductive material, producing a first layer of an upstanding encircling wall 75 (see FIG. 9E) and a side-surface shield layer 77. If the insulating film 74a is made of a non-photosensitive synthetic resin, then a groove may be formed around the opening in the insulating film 74a by a laser beam processing process. As depicted in FIG. 9C, an insulating film 74b is stacked as a second layer on the insulating film 74a as the first layer, the insulating film 74b having an opening defined therein that is larger than the opening defined in the insulating film 74a.

Figure 9D:
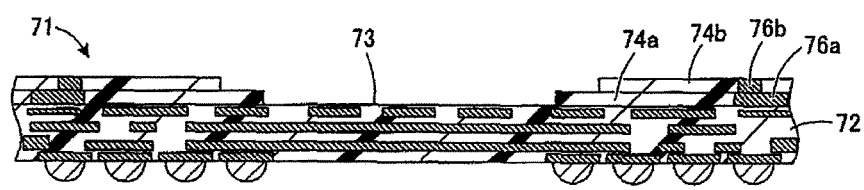
Figure 9E:
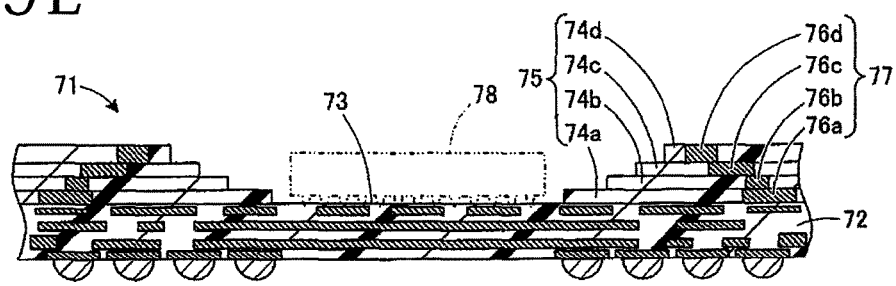

Then, as depicted in FIG. 9D, a groove is formed around the opening in the insulating film 74b and filled with an annular layer 76b of an electrically conductive material. The annular layer 76b as the second layer and the annular layer 76a as the first layer are connected to each other, and a second layer of the upstanding encircling wall 75 (see FIG. 9E) and the side-surface shield layer 77 is produced. As depicted in FIG. 9E, the insulating films 74a through 74d and the annular layers 76a through 76d are repeatedly stacked until the upstanding encircling wall 75 becomes higher than a semiconductor chip 78 to be mounted on the mount 73, whereupon the upstanding encircling wall 75 and the side-surface shield layer 77 are formed around the mount 73. The openings in the insulating films 74a through 74d are progressively larger as the number of stacked films increases, so that the upstanding encircling wall 75 has an inner peripheral surface including as a slanted surface.

After a wiring board 71 has been prepared in the above wiring board preparing step, the steps of the method of manufacturing a semiconductor package according to the first or second embodiment are performed to manufacture a semiconductor package. The above wiring board preparing step is applicable not only to a wiring board for flip-chip bonding, but also to a wiring board for wire bonding. If the upstanding encircling wall is to have an inner peripheral surface including a vertical surface, then insulating films having openings of the same size are stacked together.

In the method of manufacturing a semiconductor package according to the third embodiment, the upstanding encircling wall 75 and the side-surface shield layer 77 can be formed to a nicety in the wiring board 71 by film lamination. As with the first embodiment, it is possible to efficiently form shield layers to predetermined thicknesses in and on the semiconductor package 65.

Fourth Embodiment

Figure 10A:
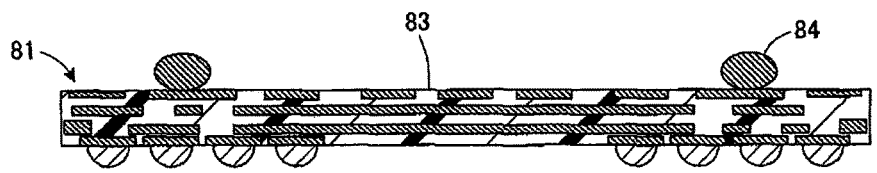
FIGS. 10A and 10C are cross-sectional views illustrative of an example of a wiring board preparing step according to a fourth embodiment of the present invention.
Figure 10B:
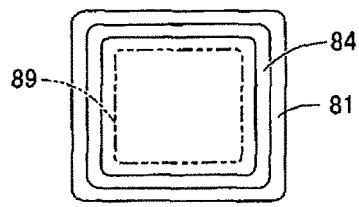
FIG. 10B is a plan view of a wiring board.
Figure 10C:
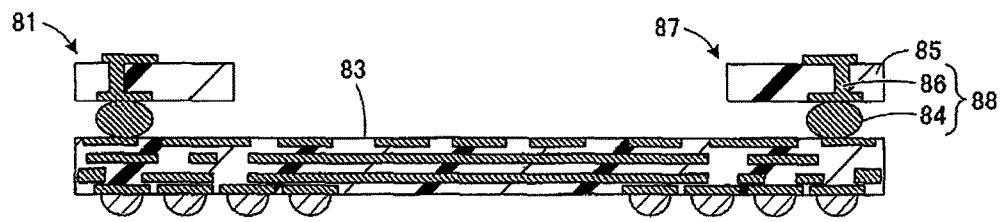
Figure 11:
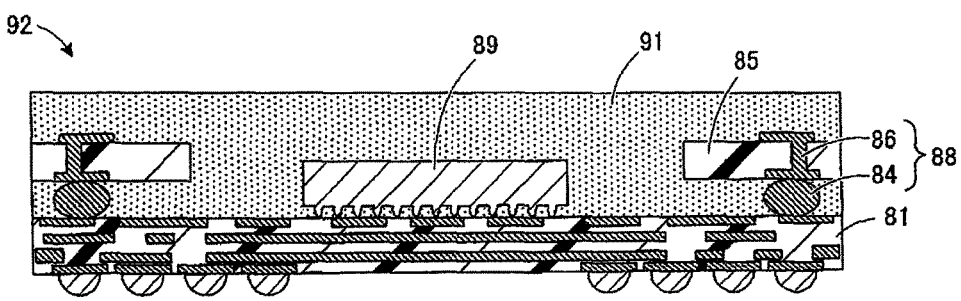
FIG. 11 is a fragmentary cross-sectional view illustrative of an example of an sealed board forming step according to the fourth embodiment of the present invention.

A method of manufacturing a semiconductor package according to a fourth embodiment of the present invention will hereinafter be described below with reference to FIGS. 10A through 10C and 11. The method of manufacturing a semiconductor package according to the fourth embodiment is different from the methods of manufacturing a semiconductor package according to the first and second embodiments only as to a wiring board preparing step. Therefore, the wiring board preparing step according to the fourth embodiment will mainly be described below. FIGS. 10A through 10C are illustrative of an example of the wiring board preparing step according to the fourth embodiment. FIGS. 10A and 10B illustrate a sealing step, and FIG. 10C illustrates an upstanding encircling wall forming step. FIG. 11 illustrates an sealed board forming step according to the fourth embodiment.

As depicted in FIGS. 10A and 10B, a sealing step is initially performed in the wiring board preparing step. In the sealing step, a plurality of mounts 83 on a wiring board 81 are sealed by an electrically conductive agent 84 that is applied in surrounding relation to the mounts 83. Specifically, the wiring board 81 contains electrodes and interconnects including ground lines, etc., and the electrically conductive agent 84 is applied to the wiring board 81 in surrounding relation to the mounts 83 by a dispenser, not depicted, or the like. According to the present embodiment, semiconductor chips 89 (see FIG. 11) may be mounted on the respective mounts 83 before the electrically conductive agent 84 is applied to the wiring board 81. Sealing with the electrically conductive agent 84 is not limited to any particular methods. The electrically conductive agent 84 may be applied to the wiring board 81 by a screen printing process, for example.

As depicted in FIG. 10C, the sealing step is followed by an upstanding encircling wall forming step. In the upstanding encircling wall forming step, an open interposer 85 is stacked over the wiring board 81 with the electrically conductive agent 84 interposed therebetween. The open interposer 85 has openings defined therein through which semiconductor chips 89 (see FIG. 11) are to be mounted on the respective mounts 83, and also has an electrically conductive material 86 disposed in annular layers around the respective openings. The openings in the open interposer 85 are positioned over the respective mounts 83, and the open interposer 85 is bonded to the wiring board 81 by the electrically conductive agent 84, electrically connecting the electrically conductive material 86 of the open interposer 85 to electrodes of the wiring board 81.

Upstanding encircling walls 87 which are higher than the semiconductor chips 89 are thus formed around the respective mounts 83, and the electrically conductive agent 84 and the electrically conductive material 86 of the open interposer 85 jointly make up a side-surface shield layer 88. The upstanding encircling walls 87 and the side-surface shield layer 88 can be formed in a short period of time and at a low cost simply by bonding the open interposer 85 to the wiring board 81. The electrically conductive agent 84 does not need to be applied fully around the mounts 83, but may have gaps or spaced intervals smaller than the wavelength of electromagnetic waves in order to block electromagnetic noise.

After the wiring board 81 has been prepared in the manner described above, the steps of the method of manufacturing a semiconductor package according to the first or second embodiment are performed to manufacture a semiconductor package. In the sealed board forming step, the wiring board 81 with the semiconductor chips 89 mounted thereon, the open interposer 85, and the electrically conductive agent 84 are sealed by a sealing synthetic resin 91, thereby producing an sealed board 92 (see FIG. 11). The open interposer 85 is reinforced by the sealing synthetic resin 91. The above wiring board preparing step is applicable not only to a wiring board for flip-chip bonding, but also to a wiring board for wire bonding.

In the method of manufacturing a semiconductor package according to the fourth embodiment, the upstanding encircling wall 87 and the side-surface shield layer 88 can be formed in a short period of time and at a low cost on the wiring board 81 by sealing the wiring board 81 with the electrically conductive agent 84. As with the first embodiment, it is possible to efficiently form a shield layer to a predetermined thickness in the semiconductor package. The electrically conductive agent 84 may be of any material insofar as it is electrically conductive, and may be of a metal as a single element or an alloy of metals.

Fifth Embodiment

Figure 12A:
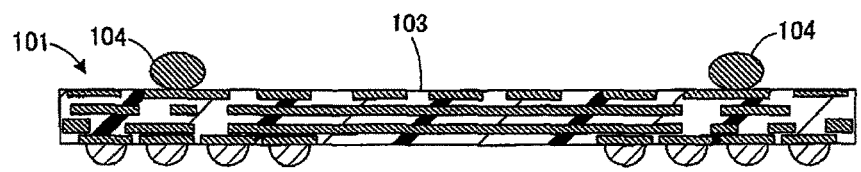
FIGS. 12A and 12C are cross-sectional views illustrative of an example of a wiring board preparing step according to a fifth embodiment of the present invention.
Figure 12B:
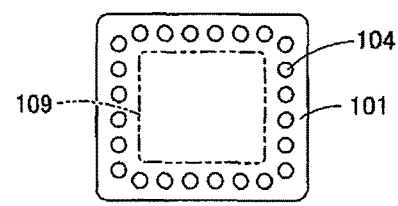
FIG. 12B is a plan view of a wiring board.
Figure 12C:
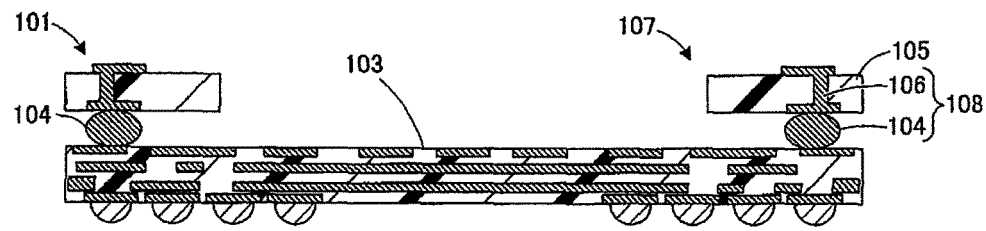
Figure 13:
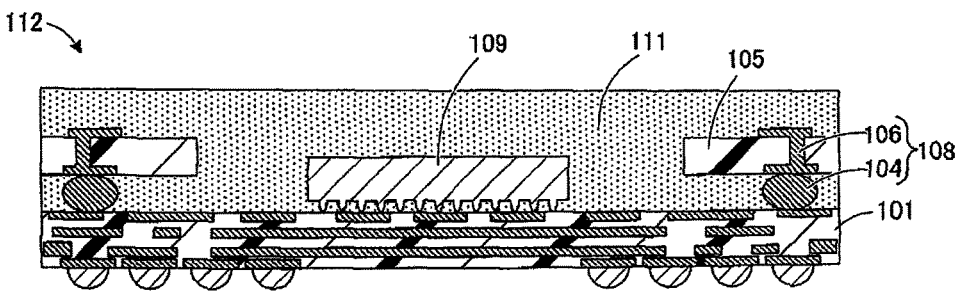
FIG. 13 is a cross-sectional view illustrative of an example of an sealed board forming step according to the fifth embodiment.

A method of manufacturing a semiconductor package according to a fifth embodiment of the present invention will hereinafter be described below with reference to FIGS. 12A through 12C and 13. The method of manufacturing a semiconductor package according to the fifth embodiment is different from the methods of manufacturing a semiconductor package according to the first and second embodiments only as to a wiring board preparing step. Therefore, the wiring board preparing step according to the fifth embodiment will mainly be described below. FIGS. 12A through 12C are illustrative of an example of the wiring board preparing step according to the fifth embodiment. FIGS. 12A and 12B illustrate a placing step, and FIG. 12C illustrates an upstanding encircling wall forming step. FIG. 13 illustrates an sealed board forming step according to the fifth embodiment.

As depicted in FIGS. 12A and 12B, a placing step is initially carried out in the wiring board preparing step. In the placing step, a plurality of electrically conductive agents 104 such as of solder or the like are placed at spaced intervals on a wiring board 101 in surrounding relation individually to a plurality of mounts 103 on the wiring board 101. Specifically, a wiring board 101 containing electrodes and interconnects including ground lines is prepared, and a plurality of electrically conductive agents 104 are placed at equal intervals in surrounding relation individually to a plurality of mounts 103 on the wiring board 101 by a dispenser, not depicted, or the like. According to the present embodiment, semiconductor chips 109 (see FIG. 13) may be mounted on the respective mounts 103 before the electrically conductive agents 104 are applied to the wiring board 101. The placing step may be carried out by soldering.

As depicted in FIG. 12C, the placing step is followed by an upstanding encircling wall forming step. In the upstanding encircling wall forming step, an open interposer 105 is stacked over the wiring board 101 with the electrically conductive agents 104 interposed therebetween. The open interposer 105 has openings defined therein through which semiconductor chips 109 (see FIG. 13) are to be mounted on the respective mounts 103, and also has an electrically conductive material 106 disposed as annular layers around the respective openings. The openings in the open interposer 105 are positioned over the respective mounts 103, and the open interposer 105 is bonded to the wiring board 101 by the electrically conductive agents 104, electrically connecting the electrically conductive material 106 of the open interposer 105 to electrodes of the wiring board 101.

Upstanding encircling walls 107 which are higher than the semiconductor chips 109 are thus formed around the respective mounts 103, and the electrically conductive agents 104 and the electrically conductive material 106 of the open interposer 105 jointly make up a side-surface shield layer 108. Gaps between the electrically conductive agents 104 are smaller than the wavelength of electromagnetic noise, so that electromagnetic noise can be blocked even through the electrically conductive agents 104 are spaced from each other. The upstanding encircling walls 107 and the side-surface shield layer 108 can be formed in a short period of time and at a low cost simply by bonding the open interposer 105 to the wiring board 101. The working time can further be made shorter by intermittently supplying the electrically conductive agents than sealing.

After the wiring board 101 has been prepared in the manner described above, the steps of the method of manufacturing a semiconductor package according to the first or second embodiment are performed to manufacture a semiconductor package. In the sealed board forming step, the wiring board 101 with the semiconductor chips 109 mounted thereon, the open interposer 105, and the electrically conductive agents 104 are sealed by a sealing synthetic resin 111, thereby producing an sealed board 112 (see FIG. 13). The open interposer 105 is reinforced by the sealing synthetic resin 111. The above wiring board preparing step is applicable not only to a wiring board for flip-chip bonding, but also to a wiring board for wire bonding.

In the method of manufacturing a semiconductor package according to the fifth embodiment, the upstanding encircling wall 107 and the side-surface shield layer 108 can be formed in a short period of time and at a low cost on the wiring board 101 by intermittently supplying sealing the wiring board 101 with the electrically conductive agents 104. As with the first embodiment, it is possible to efficiently form a shield layer to a predetermined thickness in the semiconductor package. The electrically conductive agents 104 may be of any material insofar as it is electrically conductive, and may be of a metal as a single element or an alloy of metals.

Figure 14A:
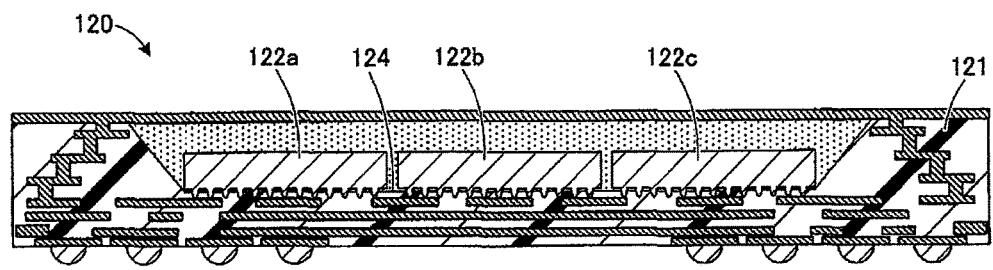
FIGS. 14A and 14B are cross-sectional views of a modified semiconductor package.

In the first through fifth embodiments, the semiconductor packages in which one semiconductor chip is mounted on a wiring board have been illustrated by way of example. However, the present invention is not limited to such a structure. A semiconductor package may be manufactured by mounting a plurality of semiconductor chips on a wiring board. For example, as depicted in FIG. 14A, a plurality of (e.g., three) semiconductor chips 122a, 122b, and 122c may be mounted on a wiring board 121, and the semiconductor chips 122a, 122b, and 122c may be shielded altogether to fabricate a semiconductor package 120. According to this modification, one mount 124 is provided for the semiconductor chips in the wiring board preparing step, and the entire assembly is divided into semiconductor packages in the individualizing step. The semiconductor chips 122a, 122b, and 122c may have the same function or may have different functions.

Figure 14B:
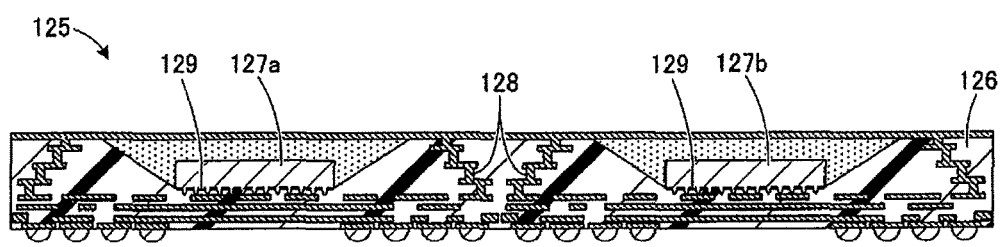

Alternatively, as depicted in FIG. 14B, a plurality of (e.g., two) semiconductor chips 127a and 127b may be mounted on a wiring board 126, and the semiconductor chips 127a and 127b may be individually shielded to fabricate a semiconductor package (SIP) 125. According to this modification, respective mounts 129 are provided for the semiconductor chips in the wiring board preparing step, and the entire assembly is divided into semiconductor packages in the individualizing step. A side-surface shield layer 128 is thus formed between the semiconductor chips 127a and 127b for preventing them from affecting each other with electromagnetic noise. The semiconductor chips 122a, 122b, and 122c may have the same function or may have different functions.

Figure 15:
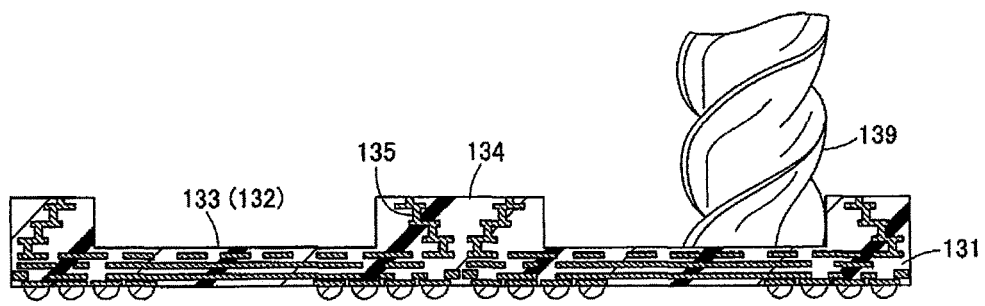
FIG. 15 is a cross-sectional view illustrative of a modification of the wiring board preparing step.

According to the third through fifth embodiments, a wiring board is formed by laminating films, sealing mounts with an electrically conductive agent, and intermittently supplying electrically conductive agents in the wiring board preparing step. However, the present invention is not limited to such an arrangement. The wiring board preparing step may be of such a nature as to be able to prepare a wiring board in which an upstanding encircling wall and a side-surface shield layer are formed. For example, as depicted in FIG. 15, a wiring board 131 with a side-surface shield layer 135 embedded therein in surrounding relation to a mount 133 is prepared, and a cavity 132 is formed in the mount 133 by a machining process performed on the wiring board 131 with a drill 139 or the like. An upstanding encircling wall 134 is thus formed in which the side-surface shield layer 135 is embedded therein in surrounding relation to the cavity 132.

According to the third through fifth embodiments, furthermore, an upstanding encircling wall which is higher than a semiconductor chip is formed around a mount. However, the present invention is not limited to such a structure. As with the first and second embodiments, a semiconductor chip may be higher than an upstanding encircling wall.

According to the third through fifth embodiments, moreover, the individualizing step is carried out using a cutting blade. However, the present invention is not limited to such an arrangement. The individualizing step may be of such a nature as to divide an sealed board into individual packages. For example, an sealed board may be divided into individual packages using a machine tool such as a profiler or the like or may be divided into individual packages according to a laser processing process such as an ablation process or the like. Laser ablation refers to a phenomenon in which, when the intensity of a laser beam applied to a solid object reaches a predetermined processing threshold or higher, the laser beam is transformed into electronic, thermal, optical, and dynamic energies at the surface of the solid object, causing the solid object to explosively emit neutral atoms, molecules, positive and negative ions, radicals, clusters, electrons, and light thereby to etch the surface of the solid object.

According to the first through fifth embodiments, a synthetic resin layer is removed from an sealed board, exposing the upper end of a side-surface shield layer in the grinding step or the cutting step. However, the present invention is not limited to such an arrangement. The grinding step or the cutting step may be omitted by filling only a space surrounded by an upstanding encircling wall with a sealing synthetic resin in the sealed board forming step.

According to the first embodiment, the grinding step has been illustrated in which the surface of a sealing synthetic resin is planarized and a sealing resin on the upper surface of an upstanding encircling wall is removed by a grinding wheel as a machine tool in the removing step. However, the present invention is not limited to such an arrangement. The removing step according to the first embodiment may be of such a nature as to be able to planarize the surface of a sealing resin and remove a sealing resin on the upper surface of an upstanding encircling wall. A sealing resin may be cut away by a cutting tool made of a cemented carbide material or may be removed along a surface by a wide blade.

According to the second embodiment, the cutting step has been illustrated in which a sealing synthetic resin on an upstanding encircling wall is cut away along a side-surface shield layer using a cutting blade as a machine tool in the removing step. However, the present invention is not limited to such an arrangement. The removing step according to the second embodiment may be of such a nature as to be able to remove a sealing synthetic resin on an upstanding encircling wall along a side-surface shield layer. For example, a sealing synthetic resin may be removed according to an ablation process or using a profiler.

According to the first through fifth embodiments, a wiring board with bumps provided thereon is prepared in the wiring board preparing step. However, the present invention is not limited to such an arrangement. The timing to provide bumps is not restrictive. Bumps may be provided after an sealed board is formed, for example.

According to the first through fifth embodiments, the steps are carried out on a wiring board while it is held by respective holding jigs. However, the present invention is not limited to such an arrangement. Each of the steps may be performed while a protective tape is stuck to the reverse side of a wiring board and the wiring board is placed on a base or the like with the protective tape interposed therebetween. Each of the holding jigs may be of such a nature as to be able to hold a substrate. For example, a chuck table having a porous holding table may be used as each of the holding jigs.

The semiconductor packages are not limited to use in mobile communication equipment such as mobile phones or the like, but may be used in other electronic equipment such as cameras or the like. Although the embodiments and modifications of the present invention have been described above, the above embodiments and modifications may be combined partly or wholly into other embodiments.

The present invention is not limited to the embodiments and modifications described above, but many changes, replacements, and modifications may be made without departing from the scope of the present invention. Furthermore, the present invention may be reduced to practice according to other techniques, processes, schemes, plans, or arrangements insofar as they are capable of implementing the principles of the present invention owing to technological advances or derivations. Therefore, the appended scope of claims should be interpreted as covering all the embodiments falling within the range of the technical idea of the present invention.

In the embodiments of the present invention, the principles of the invention are applied to methods of manufacturing a semiconductor package. However, the principles of the invention are also applicable to a method of manufacturing other package components in which a shield layer having a predetermined thickness is formed.

As described above, the present invention offers advantages in that a shield layer having a predetermined thickness can efficiently be formed, and is particularly useful as a method of manufacturing a semiconductor package for use in mobile communication equipment.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of manufacturing a semiconductor package including a semiconductor chip sealed by a sealing synthetic resin, comprising the steps of:
   preparing a wiring board having a plurality of mounts for mounting semiconductor chips thereon, the mounts being disposed in respective areas demarcated on an upper surface of a wiring board by a plurality of projected dicing lines which cross each other, upstanding encircling walls disposed between said mounts and said projected dicing lines in surrounding relation to said mounts individually, and side-surface shield layers for blocking electromagnetic waves, embedded individually within said upstanding encircling walls in surrounding relation to said mounts and extending in thicknesswise directions of said upstanding encircling walls;
   mounting the semiconductor chips individually on said mounts on said wiring board;
   supplying a sealing synthetic resin to spaces surrounded by said upstanding encircling walls over the semiconductor chips mounted on said mounts on said wiring board to seal said semiconductor chips, thereby producing a sealed board;
   after said sealed board has been produced, dividing said sealed board along said projected dicing lines into individual semiconductor packages; and
   after said sealed board has been produced, forming an upper-surface shield layer for blocking electromagnetic waves on upper surfaces of the sealing synthetic resin of said semiconductor packages.

2. The method according to claim 1, wherein said step of preparing the wiring board includes a step of:
   laminating a plurality of insulating films having openings defined therein through which the semiconductor chips are to be mounted on said mounts and filled with an electrically conductive material in surrounding relation to said openings, thereby producing said upstanding encircling walls and said side-surface shield layers.

3. The method according to claim 1, wherein:
   said step of preparing the wiring board includes steps of:
     sealing said mounts on said wiring board with an electrically conductive agent which is applied in surrounding relation to the mounts; and
     bonding an open interposer having a plurality of openings defined therein through which the semiconductor chips are to be mounted on said mounts and including an electrically conductive material surrounding said openings, to the wiring board with said openings being positioned individually over said mounts on the wiring board, thereby producing said upstanding encircling walls and said side-surface shield layers, and
   said step of supplying the sealing synthetic resin includes a step of:
     sealing said wiring board with the semiconductor chips mounted thereon, said open interposer, and said electrically conductive agent with said sealing synthetic resin, thereby producing said sealed board.

4. The method according to claim 1, wherein:
   said step of preparing the wiring board includes steps of:
     placing a plurality of electrically conductive agents at spaced intervals in surrounding relation to said mounts individually, on said wiring board; and
     bonding an open interposer having a plurality of openings defined therein through which the semiconductor chips are to be mounted on said mounts and including an electrically conductive material surrounding said openings, to the wiring board with said openings being positioned individually over said mounts on the wiring board, thereby producing said upstanding encircling walls and said side-surface shield layers, the spaced intervals between said electrically conductive agents being smaller than the wavelength of the electromagnetic waves to block said electromagnetic waves, and
   said step of supplying the sealing synthetic resin includes a step of:
     sealing said wiring board with the semiconductor chips mounted thereon, said open interposer, and said electrically conductive agents with said sealing synthetic resin, thereby producing said sealed board.

5. The method according to claim 1, wherein said side-surface shield layers include a plurality of first portions extending in thicknesswise directions of said upstanding encircling walls and a plurality of second portions configured and arranged to connect adjacent pairs of said first portions to each other.

6. The method according to claim 1, wherein an inner surface of each of said upstanding encircling walls comprises an upwardly slanted surface.

7. The method according to claim 1, wherein an upper end of each of said side-surface shield layers is exposed with respect to an upper surface of an associated one of said upstanding encircling walls.

8. The method according to claim 1, wherein each of said side-surface shield layers comprise a plurality of annular layers.

9. The method according to claim 8, wherein said plurality of annular layers are stacked and offset from each other.

10. The method according to claim 1, wherein each of said semiconductor chips has a thickness defined between an upper surface and a lower surface, with said lower surface facing said wiring board, and further wherein said side-surface shield layers extend in the thickness direction above a level of said upper surface of an associated one of said semiconductor chip.

11. A method of manufacturing a semiconductor package including a semiconductor chip sealed by a sealing synthetic resin comprising the steps of:

preparing a wiring board having a plurality of mounts for mounting semiconductor chips thereon, the mounts being disposed in respective areas demarcated on an upper surface of a wiring board by a plurality of projected dicing lines which cross each other, upstanding encircling walls disposed between said mounts and said projected dicing lines in surrounding relation to said mounts individually and side-surface shield layers for blocking electromagnetic waves, disposed individually in said upstanding encircling walls in surrounding relation to said mounts extending in thicknesswise directions of said upstanding encircling walls;

mounting the semiconductor chips individually on said mounts on said wiring board;

supplying a sealing synthetic resin to spaces surrounded by said upstanding encircling walls over the semiconductor chips mounted on said mounts on said wiring board to seal said semiconductor chips, thereby producing a sealed board;

after said scaled board has been produced, dividing said sealed board along said projected dicing lines into individual semiconductor packages;

after said sealed board has been produced, forming an upper-surface shield layer for blocking electromagnetic waves on upper surfaces of the sealing synthetic resin of said semiconductor packages; and after said sealed board has been produced and before said upper-surface shield layer is formed, planarizing the surfaces of said sealing synthetic resin and removing the sealing synthetic resin supplied to upper surfaces of said upstanding encircling walls, thereby exposing tip ends of the side-surface shield layers disposed individually in said upstanding encircling walls on the upper surfaces of said upstanding encircling walls.

12. A method of manufacturing a semiconductor package including a semiconductor chip sealed by a sealing synthetic resin, comprising the steps of:

preparing a wiring board having a plurality of mounts for mounting semiconductor chips thereon, the mounts being disposed in respective areas demarcated on an upper surface of a wiring board by a plurality of projected dicing lines which cross each other, upstanding encircling walls disposed between said mounts and said projected dicing lines in surrounding relation to said mounts individually, and side-surface shield layers for blocking electromagnetic waves, disposed individually in said upstanding encircling walls in surrounding relation to said mounts and extending in thicknesswise directions of said upstanding encircling walls;

mounting the semiconductor chips individually on said mounts on said wiring hoard;

supplying synthetic resin to spaces surrounded by said upstanding encircling walls over the semiconductor chips mounted on said mounts on said wiring board to seal said semiconductor chips, thereby producing a sealed board;

after said sealed board has been produced, dividing said sealed board along said projected dicing lines into individual semiconductor packages;

after said sealed board has been produced, forming an upper-surface shield layer for blocking electromagnetic waves on upper surfaces of the sealing synthetic resin of said semiconductor packages; and after said sealed board has been produced, removing the sealing synthetic resin supplied to upper surfaces of said upstanding encircling walls along the side-surface shield layers, thereby exposing tip ends of the side-surface shield layers disposed individually in said upstanding encircling walls.

\* \* \* \* \*

UNITED STATES PATENT AND TRADEMARK OFFICE
CERTIFICATE OF CORRECTION

PATENT NO. : 10,431,555 B2  
APPLICATION NO. : 15/879082  
DATED : October 1, 2019  
INVENTOR(S) : Byeongdeck Jang and Youngsuk Kim Page 1 of 1

It is certified that error appears in the above-identified patent and that said Letters Patent is hereby corrected as shown below:

In the Claims

Column 29, Line 27, delete "scaled" and insert --sealed--

Signed and Sealed this  
Nineteenth Day of May, 2020

Andrei Iancu  
*Director of the United States Patent and Trademark Office*